United States Patent
Yeo et al.

(10) Patent No.: US 9,023,725 B2
(45) Date of Patent: May 5, 2015

(54) FILAMENT FREE SILICIDE FORMATION

(71) Applicant: GLOBALFOUNDRIES Singapore Pte. Ltd., Singapore (SG)

(72) Inventors: Kwee Liang Yeo, Singapore (SG); Chim Seng Seet, Singapore (SG); Zheng Zou, Singapore (SG); Alex See, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/720,933

(22) Filed: Dec. 19, 2012

(65) Prior Publication Data

US 2014/0167121 A1    Jun. 19, 2014

(51) Int. Cl.
| | |
|---|---|
| *H01L 21/3205* | (2006.01) |
| *H01L 29/78* | (2006.01) |
| *H01L 29/40* | (2006.01) |
| *H01L 21/28* | (2006.01) |
| *H01L 29/66* | (2006.01) |

(52) U.S. Cl.
CPC ............ *H01L 29/78* (2013.01); *H01L 29/401* (2013.01); *H01L 21/28052* (2013.01); *H01L 29/665* (2013.01); *H01L 29/66545* (2013.01)

(58) Field of Classification Search
CPC ............. H01L 21/28247; H01L 21/76897
USPC ......... 257/621, 622, 288, 412, 377; 438/595, 438/585
See application file for complete search history.

(56) References Cited

U.S. PATENT DOCUMENTS

| | | | | |
|---|---|---|---|---|
| 6,013,569 | A  * | 1/2000 | Lur et al. ................... | 438/595 |
| 6,060,376 | A  * | 5/2000 | Gabriel et al. ............. | 438/585 |
| 6,335,253 | B1 * | 1/2002 | Chong et al. .............. | 438/305 |
| 6,365,446 | B1 * | 4/2002 | Chong et al. .............. | 438/197 |
| 6,852,589 | B2 * | 2/2005 | Huang et al. .............. | 438/241 |
| 2005/0026379 | A1 * | 2/2005 | Kammler et al. ........... | 438/303 |
| 2008/0237743 | A1 * | 10/2008 | Ramin et al. .............. | 257/407 |
| 2008/0265420 | A1 * | 10/2008 | Yu et al. ................... | 257/754 |
| 2010/0267236 | A1 * | 10/2010 | Ye et al. ................... | 438/682 |
| 2012/0267727 | A1 * | 10/2012 | Ho et al. ................... | 257/411 |

* cited by examiner

*Primary Examiner* — Evan Pert
*Assistant Examiner* — Herve Assouman
(74) *Attorney, Agent, or Firm* — Horizon IP Pte Ltd

(57) ABSTRACT

A device and methods for forming the device are disclosed. The method includes providing a substrate. A gate having a gate electrode and sidewall spacers are formed adjacent to sidewalls of the gate. A height $H_G$ of the gate is lower than a height $H_S$ of the sidewall spacers. A metal or metal alloy layer is deposited over the spacers, gate and the substrate. The substrate is processed to form metal silicide contact at least over the gate electrode. A top surface of the metal silicide contact over the gate electrode is about coplanar with a top of the sidewall spacer, and the difference between the height of the gate and spacers prevent formation of metal silicide filaments on top of the sidewall spacers.

15 Claims, 19 Drawing Sheets

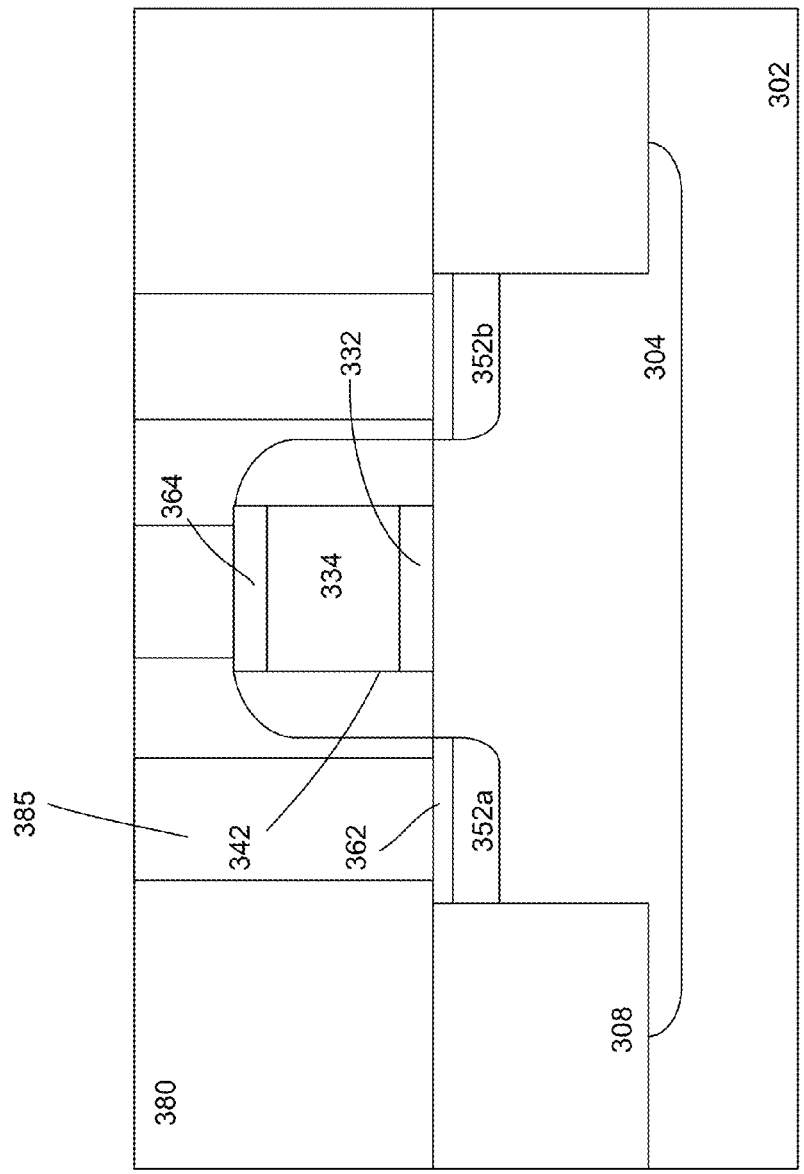

FILAMENT FREE SILICIDE FORMATION

BACKGROUND

Transistors are used in the integrated circuits (ICs). FIG. 1a shows a portion of a device 100 having a metal oxide semiconductor (MOS) transistor 110 formed on an active region of a substrate 102. A well 104 is located in the active region of the substrate. Shallow trench isolations 108 are used to isolate the active region from other device regions (not shown). The transistor has source/drain (S/D) regions 152a-b adjacent to a gate 130, which includes a gate electrode 134 over gate dielectric layer 132. Located on the gate sidewalls are dielectric spacers 142. Metal silicide contacts 162 and 164, such as nickel or nickel alloy silicide contacts, are provided on the surface of the substrate in the S/D regions and gate electrode.

We have discovered that during processing, the dielectric spacers may be over etched, resulting in spacer pulldown. The spacer pulldown exposes portions of the gate sidewalls. Thus, the thickness of the nickel or nickel alloy silicide contact formed is thicker than expected. In addition, we have discovered that excess Ni layer with highly diffusive Ni atoms will diffuse into the gate and form nickel or nickel alloy silicide filaments 167 as shown in FIG. 1a. FIG. 1b shows a TEM image of a transistor exhibiting such phenomenon. As shown in FIGS. 1a-b, nickel or nickel alloy silicide filaments are formed over the spacers. These nickel or nickel alloy silicide filaments can lead to short circuit between the gate and source/drain contact plugs formed thereafter due to contact misalignment, negatively affecting device performance or functionality.

In view of the foregoing, it is desirable to provide transistors with metal silicide contacts without filament formation.

SUMMARY

Embodiments generally relate to semiconductor devices. In one embodiment, a method for forming a device is disclosed. The method includes providing a substrate. A gate having a gate electrode and sidewall spacers are formed adjacent to sidewalls of the gate. A height $H_G$ of the gate is lower than a height $H_S$ of the sidewall spacers. A metal or metal alloy layer is deposited over the spacers, gate and the substrate. The substrate is processed to form metal silicide contact at least over the gate electrode. A top surface of the metal silicide contact over the gate electrode is about coplanar with a top of the sidewall spacer, and the difference between the height of the gate and spacers prevent formation of metal silicide filaments on top of the sidewall spacers.

In another embodiment, a device is presented. The device includes a transistor disposed on a substrate. The transistor includes a gate and sidewall spacers adjacent to sidewalls of the gate. A height of the gate is lower than a height of the sidewall spacers. Metal silicide contact is disposed on at least the gate. A top surface of the metal silicide contact over the gate electrode is about coplanar with a top of the sidewall spacer, and the difference between the height of the gate and spacers prevent formation of metal silicide filaments on top of the sidewall spacers.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the invention are described with reference to the following drawings, in which:

FIGS. 3a-j show an embodiment of a process for forming a semiconductor device.

DETAILED DESCRIPTION

Embodiments generally relate to semiconductor device and method for forming a semiconductor device. More particularly, the embodiments relate to semiconductor device having transistors with metal silicide contacts without filament formation. The transistors can be incorporated into ICs. The ICs can be any type of IC, for example dynamic or static random access memories, signal processors, or system on chip devices, mixed signal or analog devices such as A/D converters and switched capacitor filters. Other types of ICs are also useful. Such ICs are incorporated in, for example, communication systems, various types of consumer products, etc.

Figure 1A:
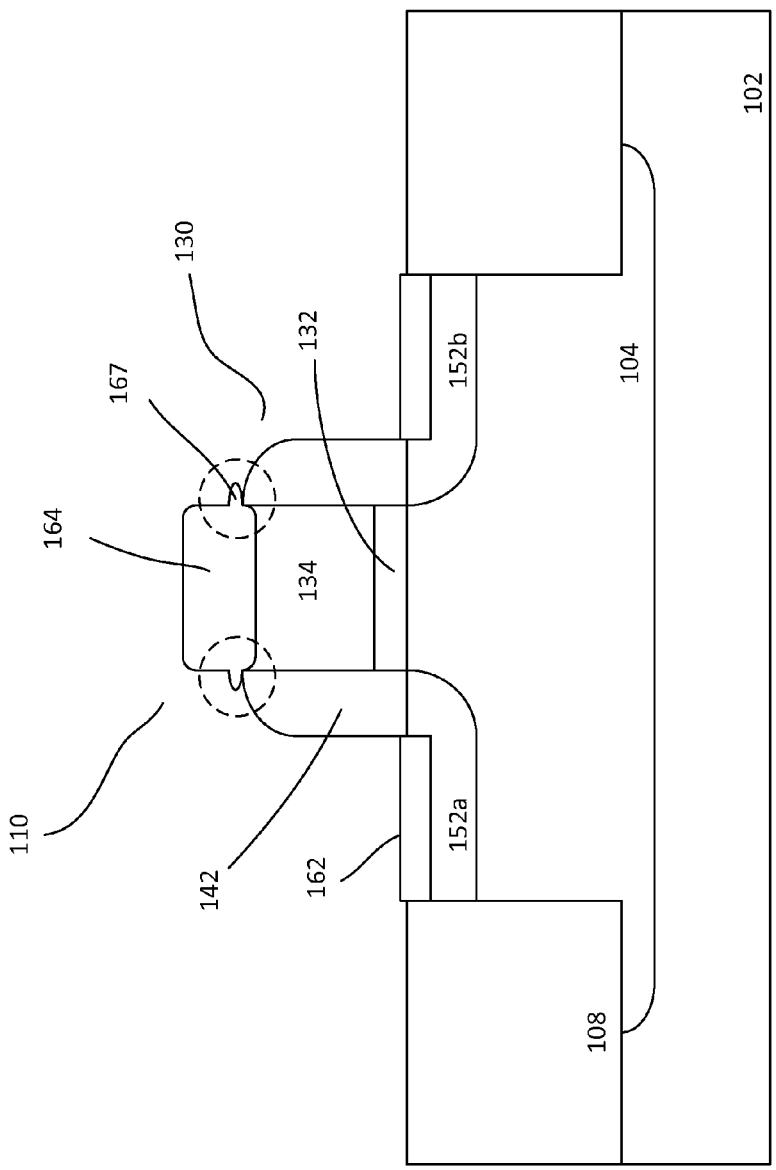
FIGS. 1a-b show a transistor with metal silicide filaments.
Figure 1B:
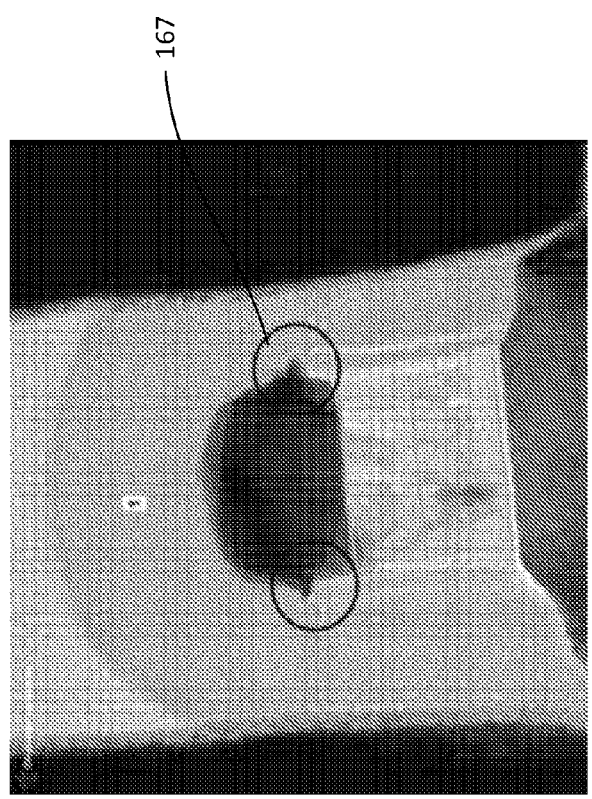
Figure 2:
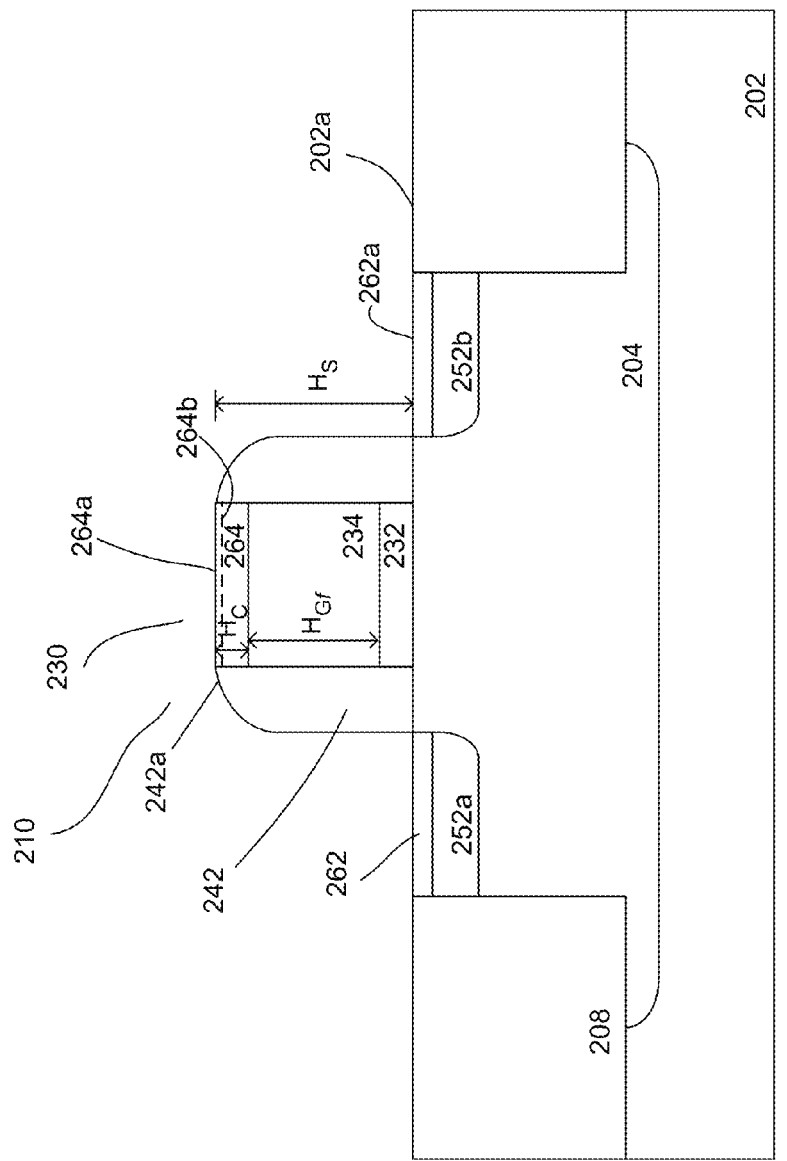
FIG. 2 shows an embodiment of a portion of a semiconductor device.

FIG. 2 shows an embodiment of a portion of a device 200. As shown, the portion includes a substrate 202. The substrate, for example, includes a silicon substrate. Other types of semiconductor substrates, for example, SiGe, SiGeC, SiC, silicon-on-insulators (SOIs), SiGe-on-insulators (SGOIs), are also useful. The substrate, for example, includes a lightly doped substrate. Providing other types of substrates may also be useful.

The portion includes a transistor 210 formed in an active region in the substrate. The active region is isolated from other device regions by isolation regions 208. The isolation regions, for example, include shallow trench isolations (STIs). The depth of the STIs should be sufficient to reduce or minimize leakage or punch-through. The substrate, for example, may optionally include a well 204 heavily doped with dopants of a second polarity type. The second polarity type includes, for example, p-type. Doping the well with n-type dopants is also useful. The depth of the well, typically, is below the bottom of the STIs.

The transistor includes a gate 230 on the substrate. The gate includes a gate electrode 234 over a gate dielectric 232. Typically, the gate electrode is formed from polysilicon and the gate dielectric is formed from oxide. Other types of materials are also useful. The thickness or the height $H_{Gf}$ of the gate electrode, for example, may be about 30-130 nm. Other thickness ranges may also be useful, for example, depending on the technology node.

Diffusion regions 252a-b, such as source/drain regions, are located adjacent to the gate beneath the substrate surface. The source/drain diffusion regions are heavily doped with dopants of a first polarity type. The first polarity type, for example, includes n-type, forming a n-type transistor. Forming p-type transistors with p-type dopants as the first polarity type is also useful. Sidewall spacers 242 are disposed on the gate sidewalls. The sidewall spacers, for example, include a dielectric material. The dielectric material, for example, includes silicon oxide. Other types of dielectric materials, such as silicon nitride, are also useful. The thickness or the height $H_S$ of the sidewall spacers from a top surface 202a of the substrate to a top of the spacer 242a, for example, is about 40-140 nm. In one embodiment, $H_S$ is about 70 nm. Other thickness ranges may also be useful, for example, depending on the technology node.

Contacts 262 and 264 are provided over the diffusion regions and gate electrode. In one embodiment, the contacts include metal silicide. The metal silicide, for example, includes nickel or nickel alloy silicide, such as nickel-platinum silicide. Other suitable types of metal silicides may also be useful. The thickness or the height $H_C$ of the metal silicide contact over the gate electrode, for example, may be about 10-30 nm. Other thickness ranges may also be useful. In one embodiment, top surface of the contact over the gate electrode can be slightly below (dotted line 264b), including being coplanar with (264a), the top of the sidewall spacers 242a while top surfaces of the contacts 262a over the diffusion regions are about coplanar with the top surface of the substrate 202a. The lower limit which the contact is below the top of the spacers should be sufficient to form metal silicide contacts without forming metal silicide filaments as well as maintaining a sufficient gate electrode thickness.

In one embodiment, the metal silicide contacts are derived by providing a gate having a thickness or height $H_G$ prior to salicide process which is lower than a height $H_S$ of the sidewall spacers and processing a metal layer on the surface of the substrate and over a top surface of the gate which is lower than the top of the sidewall spacers. For example, the height $H_G$ may be about 10-30 nm lower than the height $H_S$. Other thickness ranges may also useful, for example, depending on the final thickness of the silicide contact and technology node. By providing $H_G$ which is lower than $H_S$, formation of metal silicide filaments on top of the sidewall spacers is avoided. Since no metal silicide filaments are formed on top of the sidewall spacers, short circuit between the gate and source/drain contact plugs are also prevented. Such configuration also enables a better controlled or more uniform silicide to be formed over the gate electrode compared to conventional design.

Figure 3A:
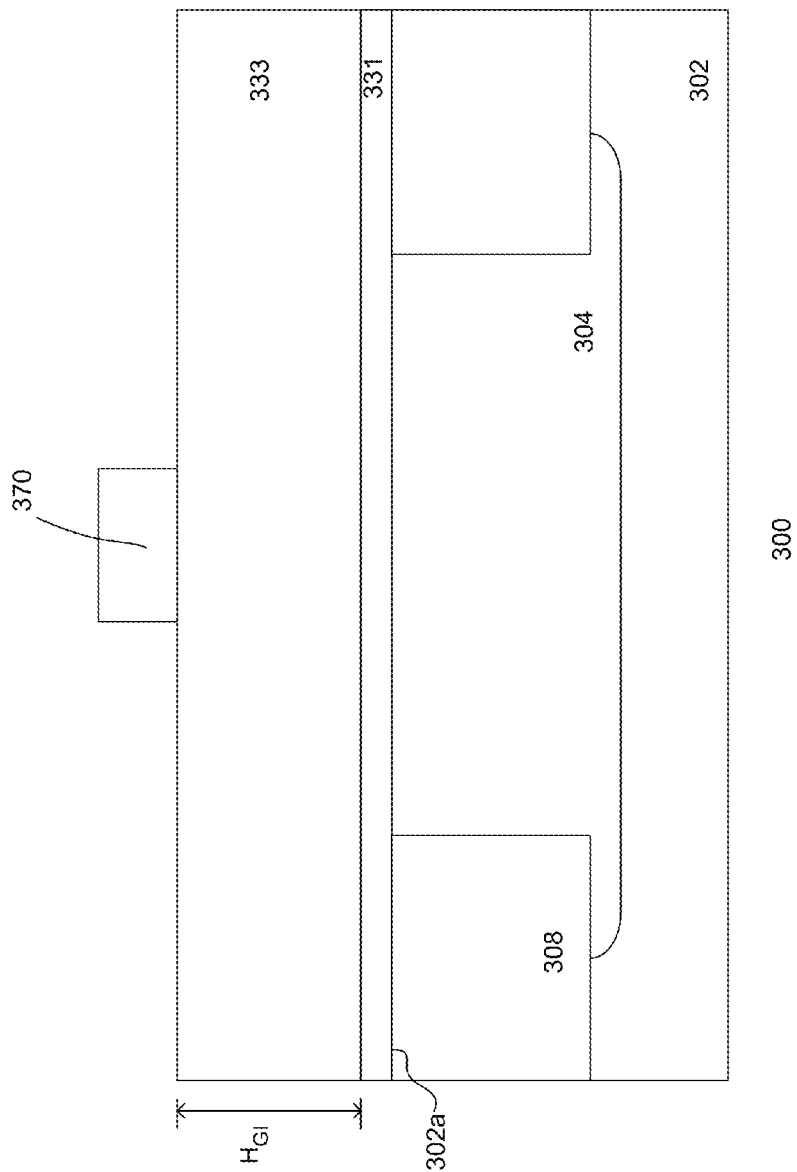

FIGS. 3a-j show an embodiment of a process for forming a device 300. Referring to FIG. 3a, a substrate 302 is provided. The substrate, for example, includes a silicon substrate. Other types of semiconductor substrates, for example, SiGe, SiGeC, SiC, silicon-on-insulators (SOIs), SiGe-on-insulators (SGOIs), are also useful. The substrate is prepared with an active region. The active region may include a deep well 304 heavily doped with dopants of a second polarity type. To form the active region, ion implantation techniques, such as implantation with a mask can be used. Other techniques for forming the active region are also useful. The second polarity type includes, for example, p-type. In one embodiment, p-type dopants, such as boron, are implanted into the substrate. The deep well, for example, is implanted with p-type dopants having a dopant concentration of about 1E11-1E14 cm$^2$ and to a depth of about 300-1000 nm from the first substrate surface 302a. Providing other types of dopants, concentration and depths may also be useful. Doping the well with n-type dopants, such as phosphorus, may also be useful.

Isolating the active regions from other device regions (not shown) on the substrate are isolation regions 308. The isolation regions, for example, include STI regions. The depth of the STIs should be sufficient to prevent leakage or punch through. Typically, the depth of the STIs is about 200-400 nm. Other depth dimensions for the STIs may also be useful. Various suitable processes can be employed to form the STI regions. For example, the substrate can be etched using etch and mask techniques to form trenches which are then filled with dielectric material such as silicon oxide. Chemical mechanical polishing (CMP) can be performed to remove excess oxide and provide a planar substrate top surface. The STI regions can be formed, for example, prior to or after the formation of the well.

Referring to FIG. 3a, the process continues to form gate layers on the substrate. For example, forming the gate layers includes sequentially forming a gate dielectric layer 331 and a gate electrode layer 333 on the substrate surface. In one embodiment, the gate dielectric layer includes SiO$_2$ or SiON. Other types of gate dielectrics are also useful. The gate dielectric layer can be formed by chemical vapor deposition (CVD) or oxidation process. The gate electrode layer, for example, includes polysilicon. Other suitable types of gate electrode materials may also be useful. The polysilicon gate layer can be formed by CVD. The polysilicon layer may be doped with dopants such as boron or phosphorus, to form a doped polysilicon to impart a higher conductivity to the gate. Other materials and techniques may also be used to form the gate layers. The polysilicon can be in-situ doped or doped by ion implantation after deposition, such as during formation of the diffusion regions. Providing undoped polysilicon is also useful. The thickness or the initial height $H_{GI}$ of the gate electrode layer may be, for example, about 50-150 nm. For example, $H_{GI}$ is about 80 nm. Other thickness ranges may also be useful, for example, depending on the technology node.

Figure 3B:
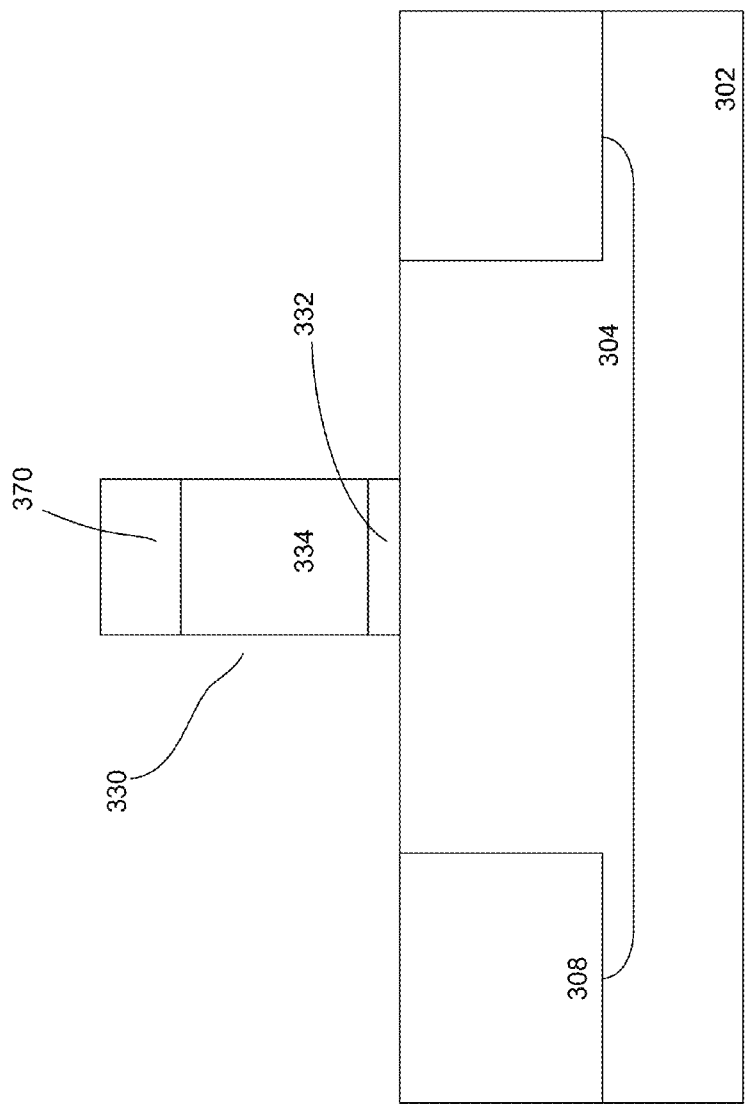

A mask layer 370 is formed on the substrate and patterned. The mask layer is patterned to expose portions of the gate electrode and gate dielectric layers to be removed. The mask layer, for example, protects at least portions corresponding to a gate of the transistor. For example, the mask serves as a gate mask. The exposed portions of the gate electrode and gate dielectric layers on the substrate are removed to form the gate 330 having a gate dielectric 332 and a gate electrode 334 of the transistor as shown in FIG. 3b. Removal can be achieved using, for example, an anisotropic etch such as RIE. Other suitable techniques may also be useful.

The patterned mask layer 370 is removed after etching. The patterned mask layer can be removed by, for example, an ashing process. Other suitable techniques may also be useful.

Figure 3C:
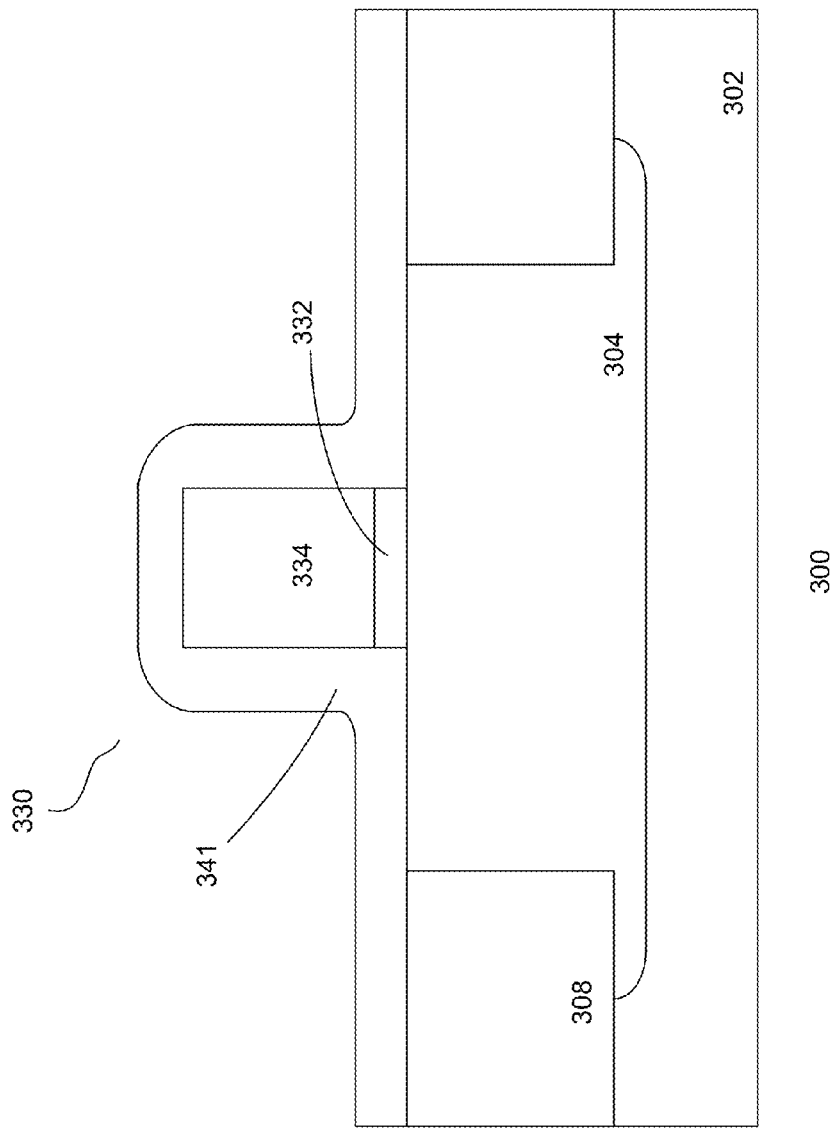

The process continues to form sidewall spacers on sidewalls of the gate. Referring to FIG. 3c, a spacer layer 341 is formed over the gate on the substrate. The spacer layer, in one embodiment, includes a dielectric material, such as silicon oxide, silicon nitride or a combination thereof. Other materials may also be used. The spacer layer, for example, is formed by depositing a blanket dielectric layer on the substrate and the gate as shown in FIG. 3c. The spacer layer is then patterned to remove the horizontal portions. Removal can be achieved, for example, using an anisotropic etch, such as RIE. Sidewall spacers 342 are formed on the sidewalls of the gate as shown in FIG. 3d.

Figure 3D:
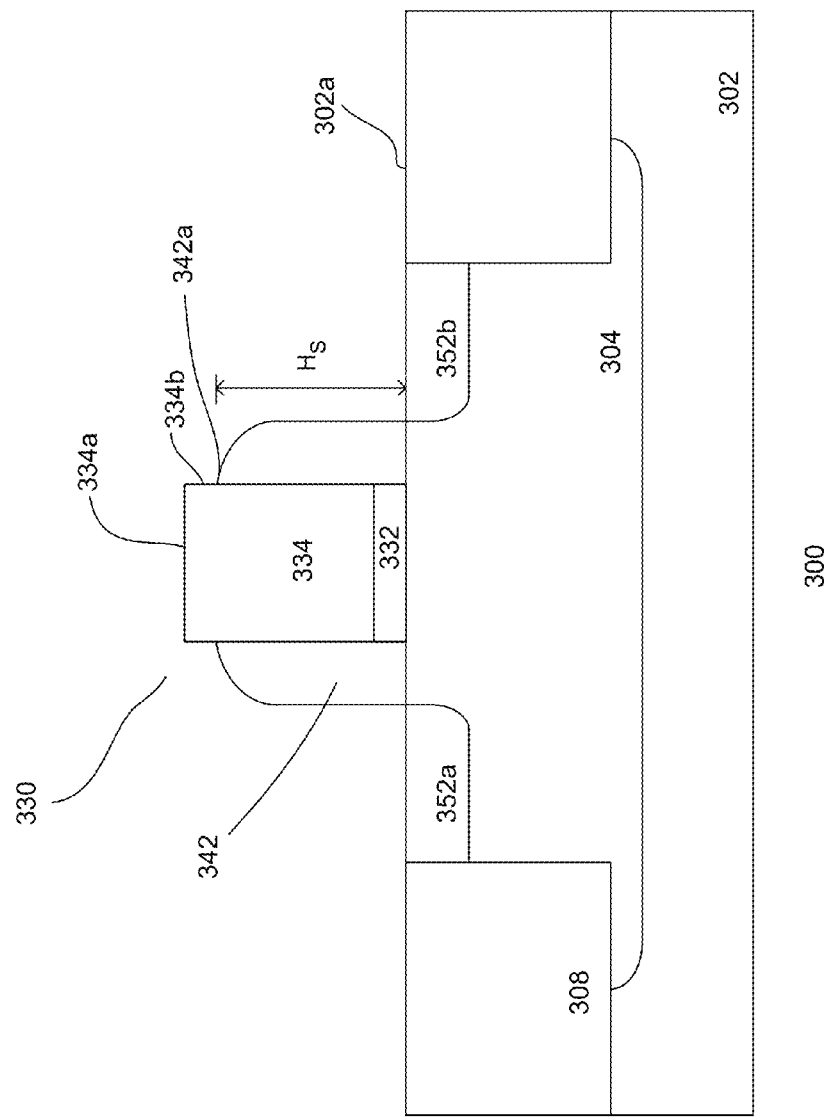

As shown in FIG. 3d, the spacer layer may be over etched during the removal of the horizontal portions of the spacer layer. This may result in pull down of the spacers below a top surface of the gate electrode layer 334a. As such, portions of the sidewalls of the gate electrode 334b are exposed. The thickness or the height $H_S$ of the sidewall spacers from a top surface 302a of the substrate to a top of the spacer 342a, for example, is about 40-140 nm. In one embodiment, $H_S$ is about 70 nm. Other thickness ranges may also be useful.

Figure 3E:
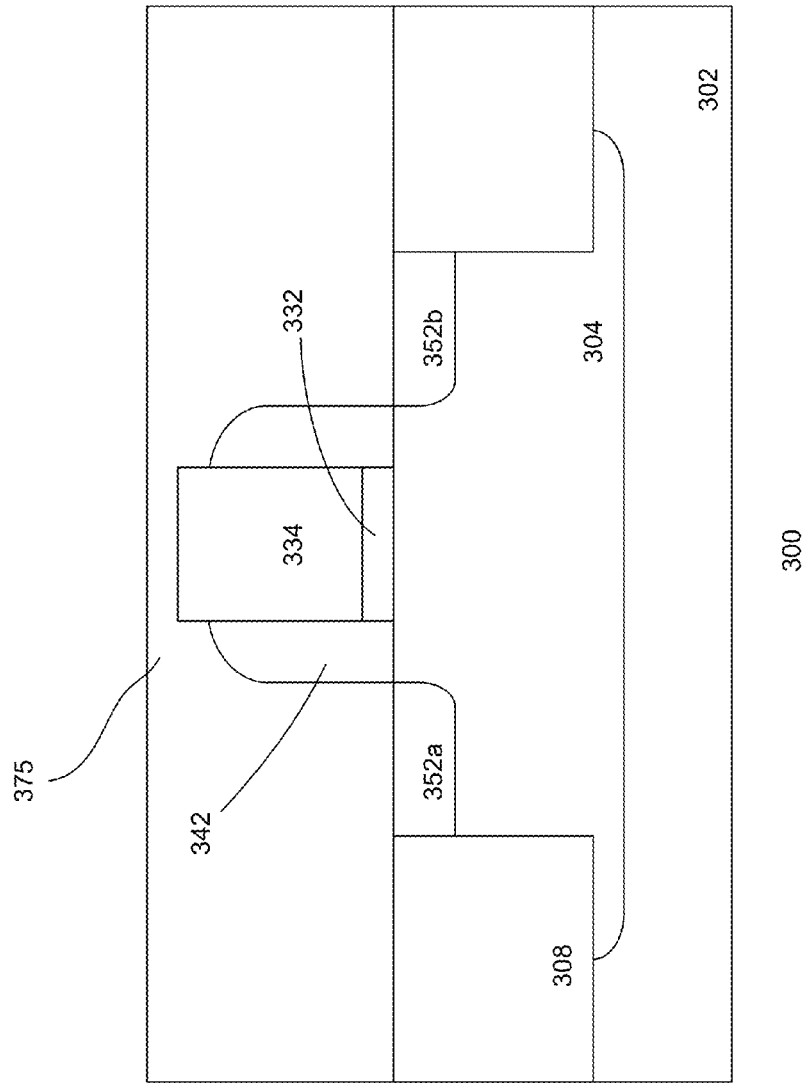

In one embodiment, a protection layer 375 is formed over the substrate as shown in FIG. 3e. The protection layer as shown in FIG. 3e, for example, covers the substrate and the gate of the transistor. The protection layer, in one embodiment, is formed from a spin-on material, such as a photoresist material. Other types of spin-on material, such as organic dielectric layer (ODL), may also be used. A portion of the protection layer is removed so that at least the top surface of the gate electrode layer 334a is exposed. In one embodiment, a first etch using a first etch chemistry is performed to remove excess protection layer. The first etch, for example, includes plasma etch with oxygen based chemistry. The excess protection layer, for example, may be etched back to form a planar top surface 375a which is coplanar with the top surface of the gate electrode 334a. Other suitable types of techniques may also be used to remove the excess protection layer.

Figure 3F:
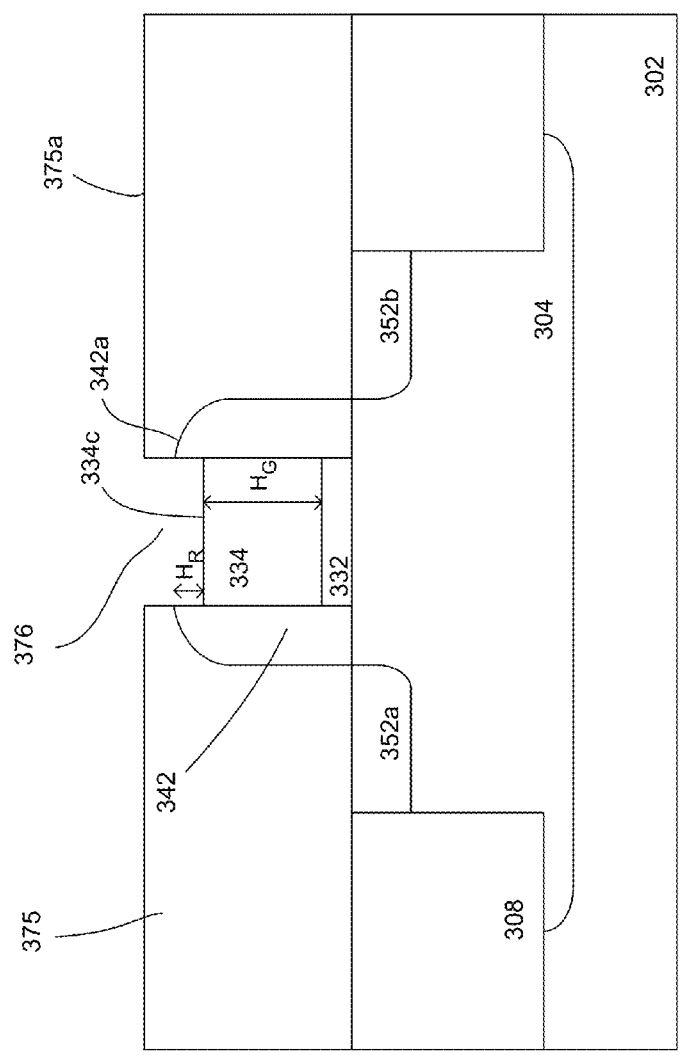

The process continues by removing a portion of the gate electrode layer. In one embodiment, a second etch using a second etch chemistry is performed to remove a portion of the gate electrode. The second etch, for example, includes an anisotropic etch such as RIE. Other suitable techniques may also be useful. Referring to FIG. 3f, the protection layer thus protects the sidewall spacers and the substrate during formation of a recess 376 in the gate electrode.

As shown in FIG. 3f, the top surface of the gate electrode 334c after the removal process is lower than a top of the sidewall spacer 342a. In one embodiment, the gate electrode after the removal process should have a sufficient gate electrode thickness and the depth of the recess $H_R$ between the top surface of the gate electrode 334c and the top of the sidewall spacer 342a should not be less than 50% of the final thickness of the metal silicide contact formed over the gate electrode in later processing. For example, the height $H_G$ prior to salicide process may be about 10-30 nm lower than the height $H_S$. Other suitable thickness ranges may also useful, for example, depending on the technology node.

Figure 3G:
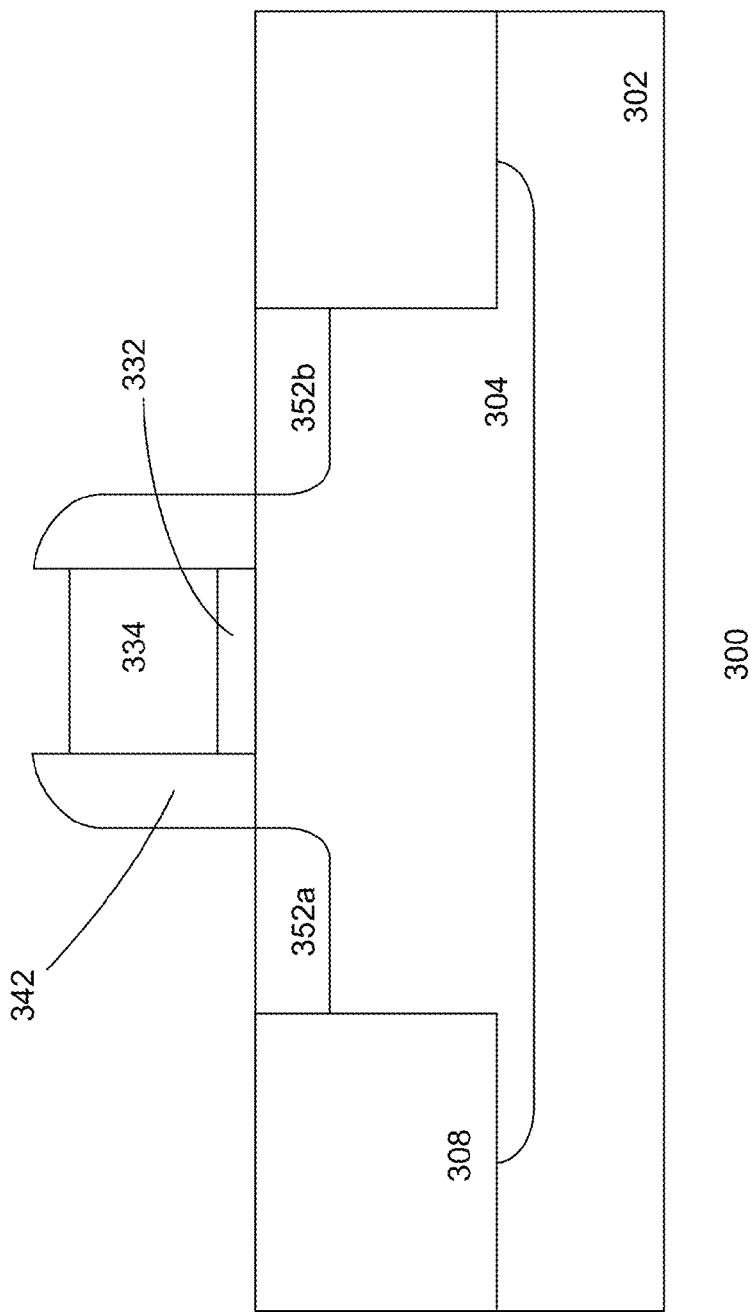

The process continues by removing the protection layer as shown in FIG. 3g. The protection layer can be removed by, for example, plasma etch with oxygen based chemistry or an ashing process. Other suitable techniques may also be useful.

Source/drain diffusion regions 352a-b are formed in the active region of the substrate adjacent to the gate. The diffusion regions, for example, include heavily doped regions of the first polarity type. The doped regions can be formed by ion implantation. The implant can be self-aligned or formed using an implant mask. Other techniques for forming the diffusion regions are also useful.

In one embodiment, the diffusion regions may include both lightly doped (LDD) and heavily doped (HDD) regions via, for example, a two-step ion implantation process. For example, the LDD regions are formed after the gate is patterned and the HDD regions are formed after spacer formation. After the formation of diffusion regions, the dopants are activated by, for example, a thermal annealing process. The anneal also serves to facilitate recovery from any deformation to the crystal structure incurred during the process of ion implantation. Typically, the anneal is carried out at about 1000 C. In the case of a soak or spike anneal, a flash or laser anneal is performed thereafter at about 900-1300 C.

Figure 3H:
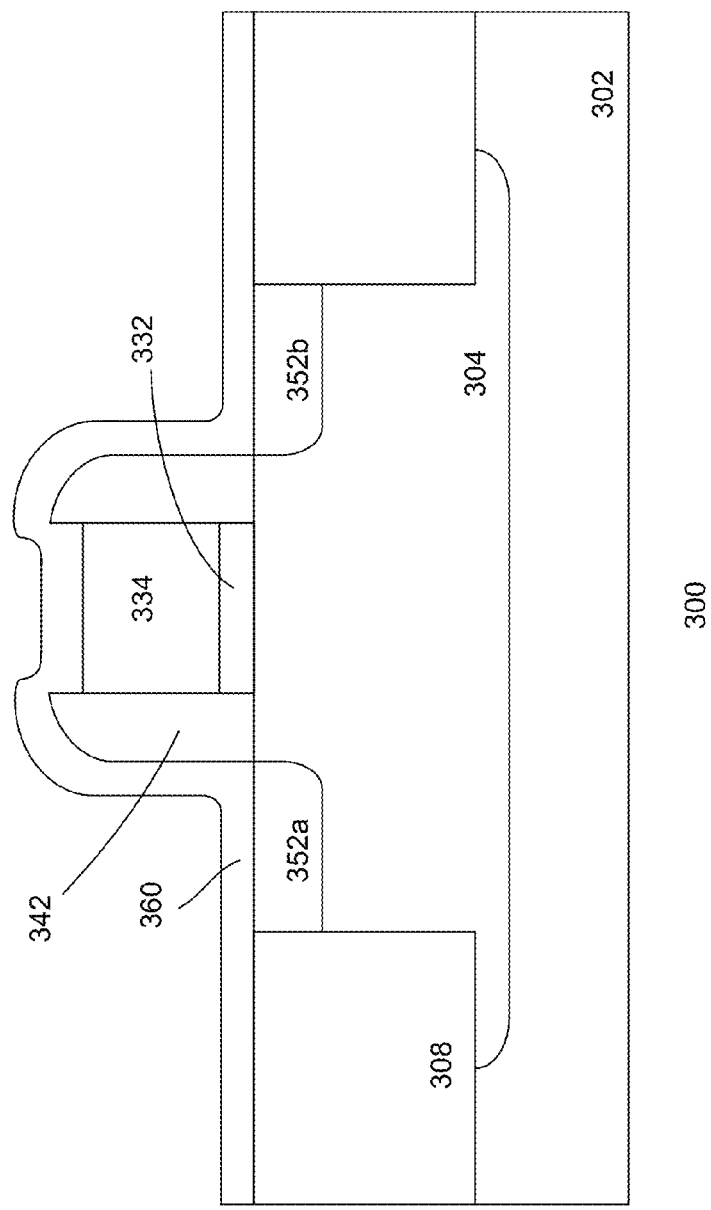

After formation of the diffusion regions, the surface of the substrate is cleaned. For example, the cleaning is achieved by various surface clean chemistries. Other cleaning chemistry or techniques may also be used. As shown in FIG. 3h, a metal layer 360 is deposited over the substrate, covering the diffusion regions and gate. Preferably, the metal layer includes nickel or nickel alloy, such as nickel platinum. Other suitable types of metal layer may also be useful. The thickness of the metal layer, for example, is about 100-150 Å. Other thickness ranges and other types of materials may also be useful.

Figure 3I:
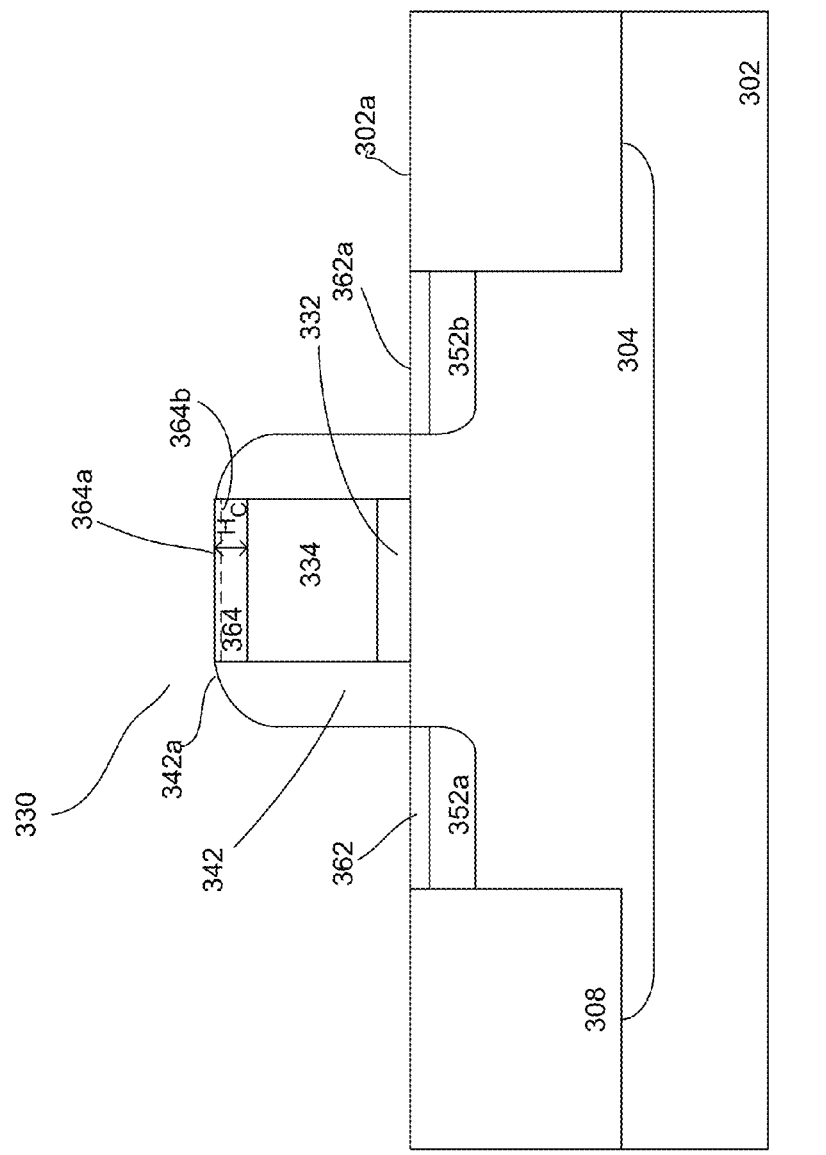

Referring to FIG. 3i, a salicide process is preformed to form metal silicide contacts over the diffusion regions and the gate electrode. In one embodiment, the salicide process forms nickel or nickel alloy silicide contacts. The salicide process, for example, includes annealing the substrate, causing a reaction between the metal and silicon (e.g., substrate and polysilicon). In one embodiment, the substrate is annealed at a temperature of about 500 C in a nitrogen ambient for about 1 sec. Other process parameters may also be useful. The unreacted metal layer on the substrate, such as over the STIs and sidewall spacers, are removed. Removal can be achieved using a selective wet etch clean to the metal material, such as nickel or nickel alloy.

As shown in FIG. 3i, contacts 362 and 364 are formed over the diffusion regions and gate electrode. The contacts, for example, include nickel or nickel alloy silicide contacts, such as nickel-platinum silicide contacts. The thickness or the height $H_C$ of the metal silicide contact over the gate electrode, for example, is about 10-30 nm. Other thickness ranges may also be useful. In one embodiment, top surface of the contact over the gate electrode can be slightly below (dotted line 364b), including being coplanar with (364a), the top of the sidewall spacers 342a while top surfaces of the contacts 362a over the diffusion regions are about coplanar with top surface of the substrate 302a. The lower limit which the contact is below the top of the spacers should be sufficient to form metal silicide contacts without forming metal silicide filaments as well as maintaining a sufficient gate electrode thickness.

The process continues by forming interconnections to the contacts of the transistors as shown in FIG. 3j. For example, a dielectric layer 380 is deposited and patterned to create vias, which are then filled with conductive material, such as copper, to form contact plugs 385. Additional processes are performed to complete the IC, for example, additional interconnect levels, final passivation, dicing, and packaging.

The process, as described, results in advantages. For example, the metal silicide contacts are derived by providing a gate having a thickness or height $H_G$ prior to salicide process which is lower than a height $H_S$ of the sidewall spacers and processing a metal layer on the surface of the substrate and over a top surface of the gate which is lower than the top of the sidewall spacers. For example, the height $H_G$ prior to salicide process may be about 10-30 nm lower than the height $H_S$. Other thickness ranges may also useful, for example, depending on the final thickness of the silicide contact and technology node. By providing $H_G$ which is lower than $H_S$, formation of metal silicide filaments on top of the sidewall spacers is avoided. Since no metal silicide filaments are formed on top of the sidewall spacers, short circuit between the gate and source/drain contact plugs are also prevented. The process as described also enables a better control of the thickness of the metal silicide contact or a more uniform metal silicide contact to be formed over the gate electrode.

Figure 4A:
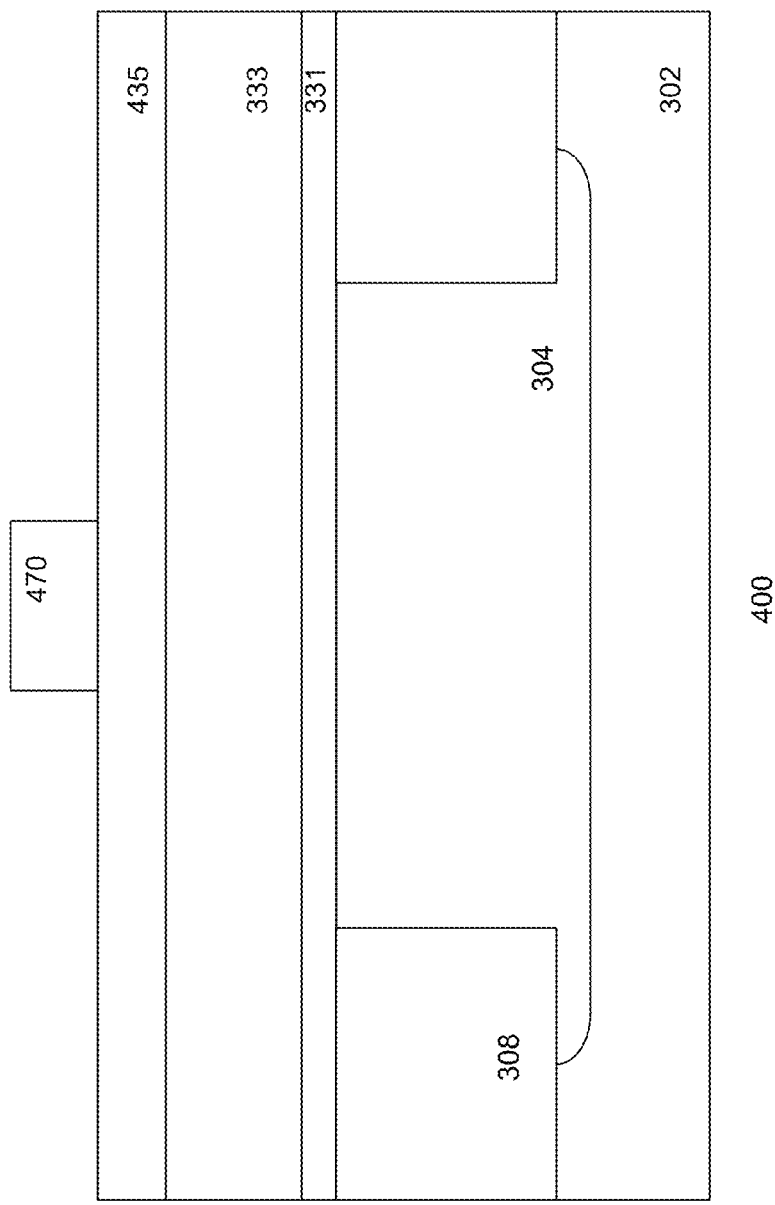
FIG. 4a-f show another embodiment of a process for forming a semiconductor device.

FIGS. 4a-f show another embodiment of a process for forming a device 400. The process is similar to that described in FIGS. 3a-j. As such, common elements may not be described or described in detail. Referring to FIG. 4a, the process is at a similar stage as that described in FIG. 3a. For example, gate layers are formed on the substrate. The gate layers include a gate dielectric layer 331 and a gate electrode layer 333 on the substrate 302. The materials and the process for forming the gate layers are similar to that described in FIG. 3a.

A hard mask layer 435 is formed on top of the gate layers. The hard mask layer, for example, includes a blanket mask layer. In one embodiment, the hard mask layer includes silicon nitride. The hard mask layer can be formed by chemical vapor deposition (CVD). Other materials and techniques may also be used to form the hard mask layer. The thickness of the hard mask layer is, for example, about 100-300 Å. Other suitable thickness dimensions may also be useful.

Figure 4B:
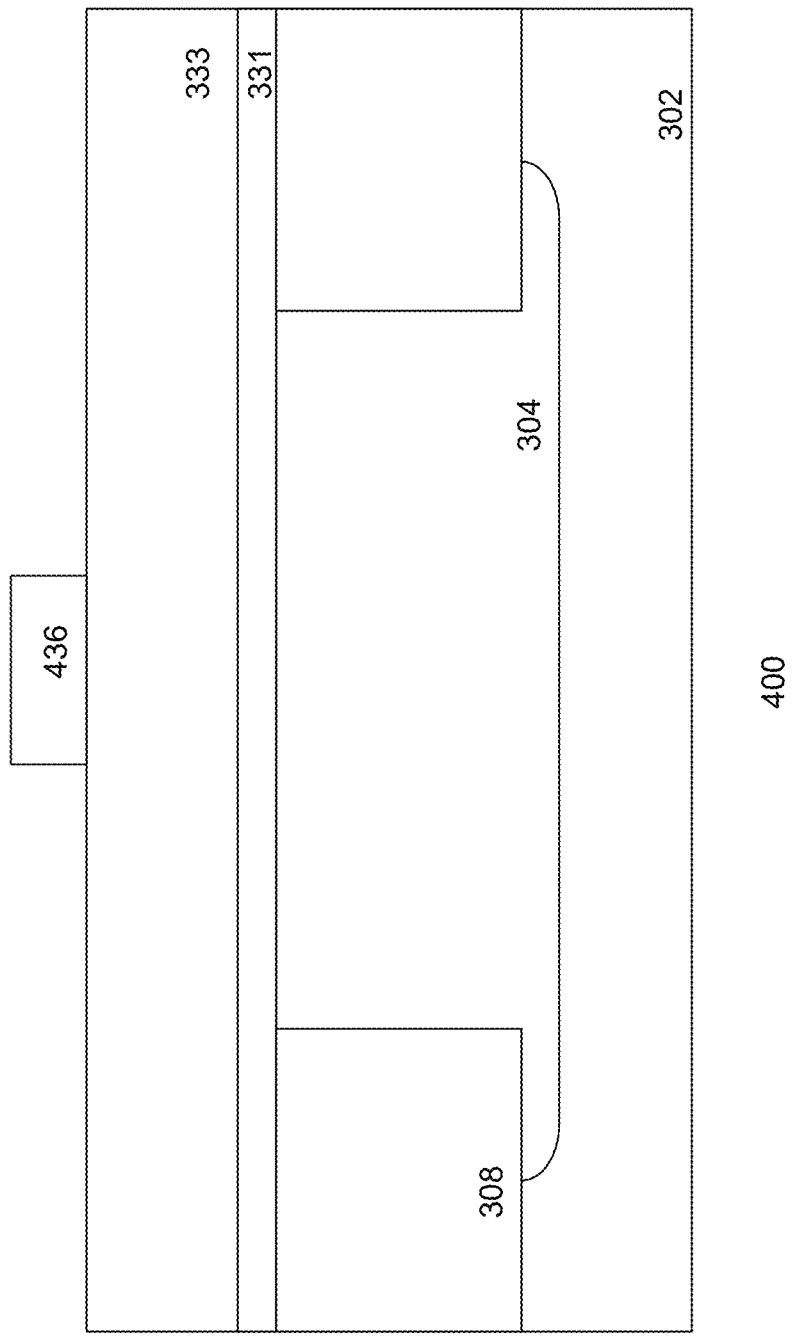

Referring to FIG. 4a, a soft mask layer is formed on the substrate and patterned. The mask layer is patterned to expose portions of the hard mask layer to be removed. The exposed portions of the hard mask layer, for example, is removed by an anisotropic etch, such as RIE as shown in FIG. 4b. Other suitable techniques may also be useful. The patterned soft mask layer 470 is then removed by suitable techniques.

Figure 4C:
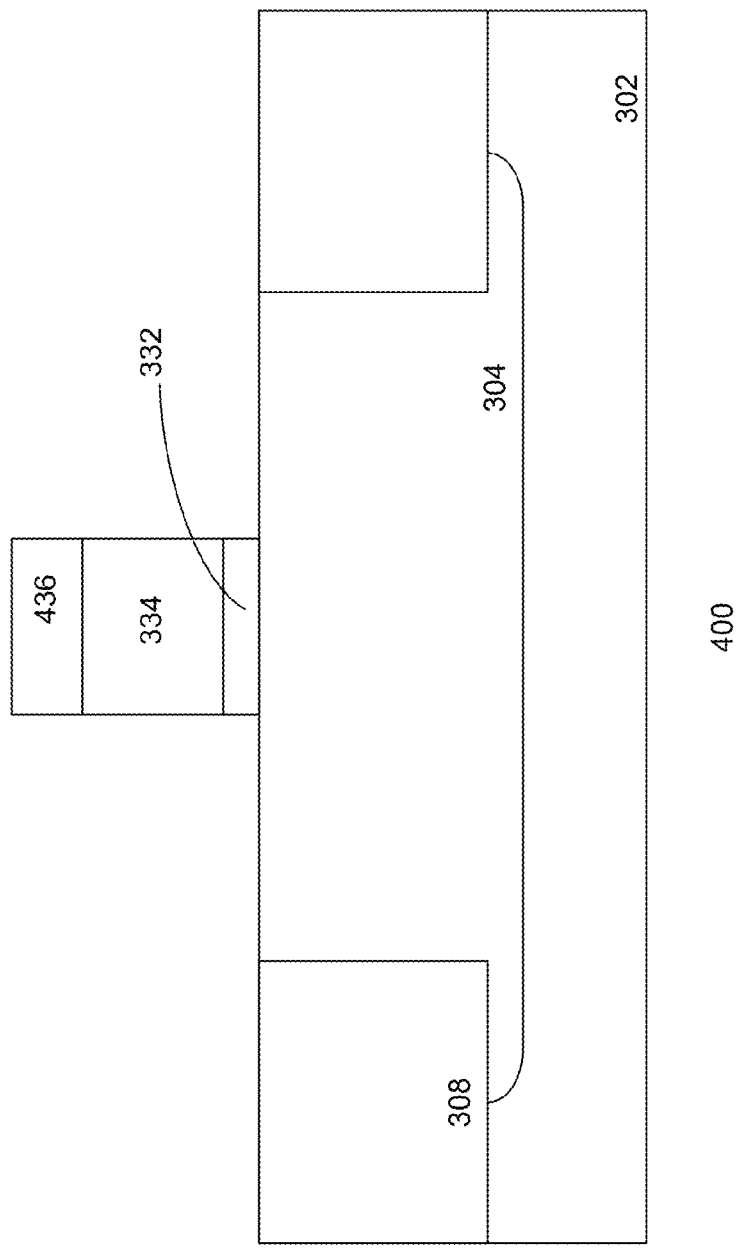

The patterned hard mask layer 436, as shown in FIG. 4c, protects at least portions corresponding to gate of the transistor. For example, the patterned hard mask serves as a gate mask. The exposed portions of the gate layers on the substrate are removed to form the gate of the transistor. Removal can be achieved using, for example, an anisotropic etch such as RIE. Other suitable techniques may also be useful.

Figure 4D:
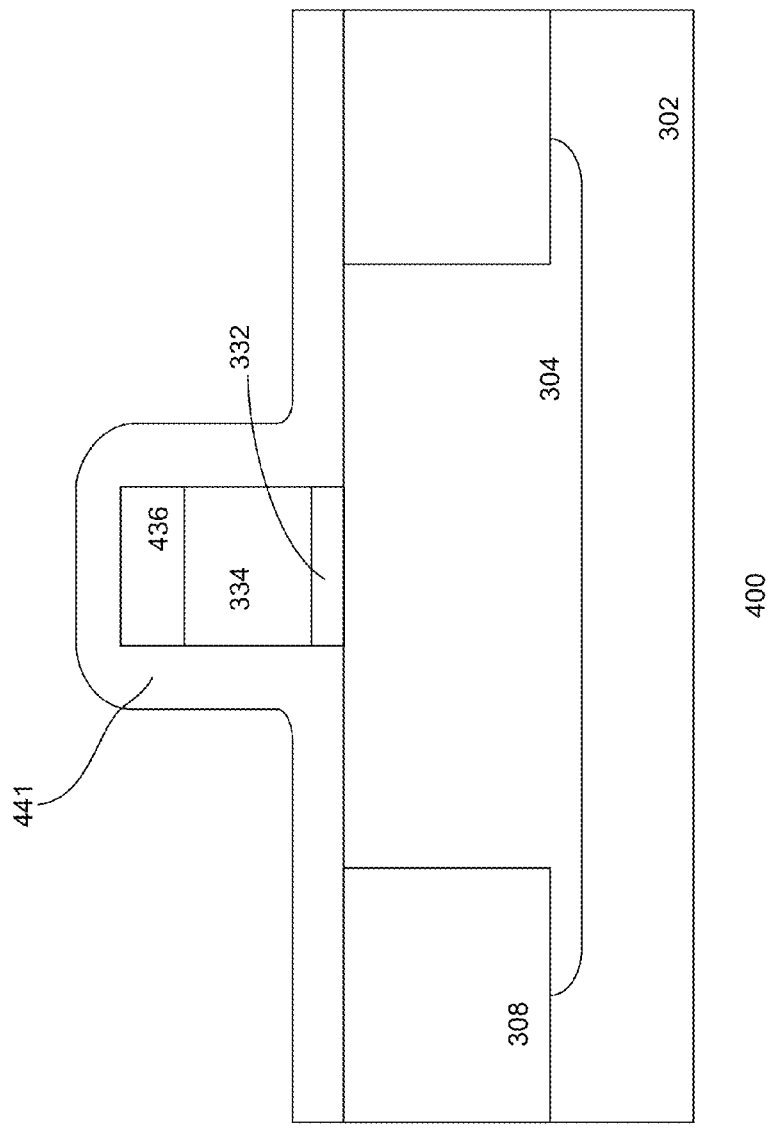

The process continues to form sidewall spacers on sidewalls of the gate and the patterned hard mask. Referring to FIG. 4d, a spacer layer 441 is formed over the hard mask and gate and the substrate. The spacer layer, in one embodiment, includes a dielectric material, such as silicon oxide, silicon nitride or a combination thereof. Other materials may also be used. The spacer layer, for example, is formed by depositing a blanket dielectric layer on the substrate and the gate and hard mask as shown in FIG. 4d. The spacer layer is then patterned to remove the horizontal portions. Removal can be achieved, for example, using an anisotropic etch, such as RIE. Sidewall spacers are formed on the sidewalls of the gate and hard mask.

Figure 4E:
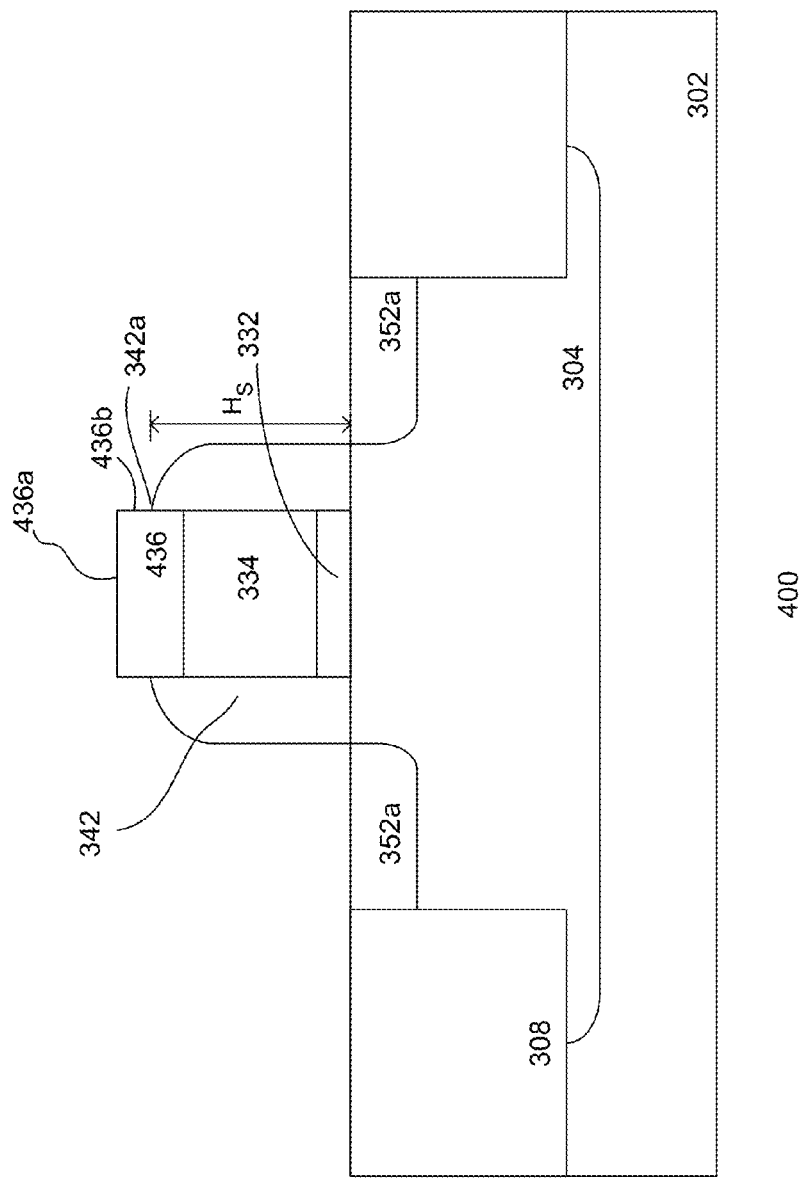

As shown in FIG. 4e, the spacer layer may be over etched during the removal of the horizontal portions of the spacer layer. This may result in pull down of the spacers 342 below a top surface of the patterned hard mask 436a. As such, portions of the sidewalls of the patterned hard mask 436b are exposed. The thickness or the height $H_S$ of the sidewall spacers, for example, is about 40-140 nm. Other thickness ranges may also be useful.

Figure 4F:
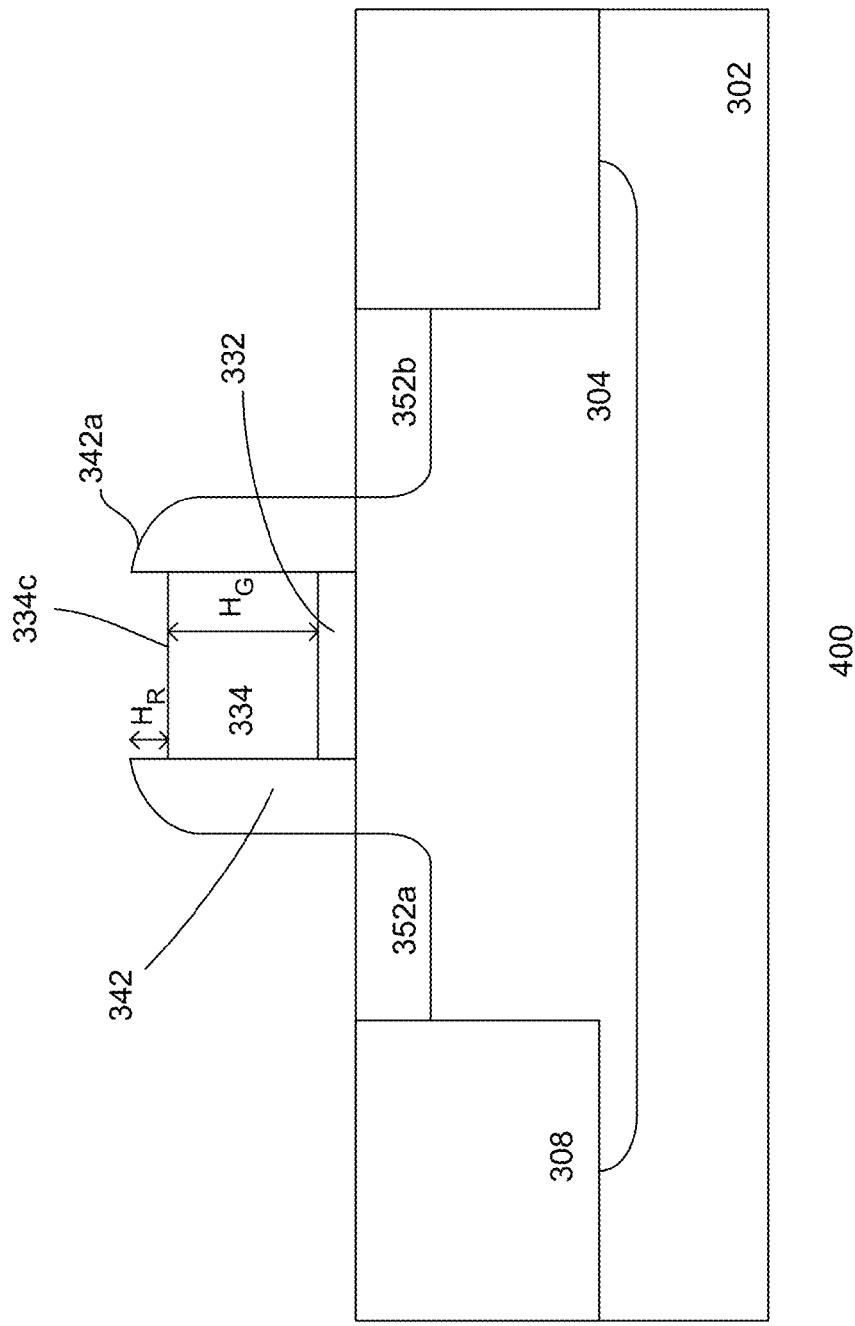

Referring to FIG. 4f, the patterned hard mask 436 on top of the gate of the transistor is removed. Removal of the hard mask layer can be achieved using an etch process, such as RIE or wet etch. Other suitable techniques may also be useful. Removal of the hard mask layer exposes top surface of the gate electrode 334c, resulting in a structure similar to that shown in FIG. 3g. As shown in FIG. 4f, the top surface of the gate electrode 334c is lower than the top of the sidewall spacers 342a. In one embodiment, the gate electrode should have a sufficient gate electrode thickness and the depth of the recess $H_R$ between the top surface of the gate electrode 334c and the top of the sidewall spacer 342a should not be less than 50% of the final thickness of the metal silicide contact formed over the gate electrode in later processing. For example, the height $H_G$ prior to salicide process may be about 10-30 nm lower than the height $H_S$. Other suitable thickness ranges may also useful, for example, depending on the technology node.

After removing the hard mask, the process continues, as similarly described in FIG. 3g and onwards. For example, the process continues to complete the formation of the device as described in FIG. 2 or 3j.

The embodiment as described with respect to FIGS. 4a-f includes some or all advantages as described with respect to FIGS. 3a-j. As such, these advantages will not be described or described in detail.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
   providing a substrate;
   forming a gate having an unsilicided gate electrode and sidewall spacers adjacent to and in direct contact with sidewalls of the gate, wherein a height $H_G$ of the gate is lower than a height $H_s$ of the sidewall spacers and a recess is defined between a top surface of the gate electrode and top of the sidewall spacers;
   depositing a single and continuous metal or metal alloy layer on and contacts the spacers, substrate and the top surface of the unsilicided gate electrode, wherein the single and continuous metal or metal alloy layer fills the recess; and
   processing the single and continuous metal or metal alloy layer to form metal silicide contacts simultaneously in the recess as well as partially within top portions of the gate electrode and diffusion regions adjacent to the gate, wherein a top surface of the metal silicide contact over the gate is about coplanar with a top of the sidewall spacer, and the difference between the height of the gate and spacers prevents formation of metal silicide filaments on top of the sidewall spacers.

2. The method of claim 1 wherein forming the sidewall spacers comprising:
   providing a spacer layer over the gate; and
   removing horizontal portions of the spacer layer to form the sidewall spacers adjacent to and in direct contact with the sidewalls of the gate, wherein the top of the sidewall spacer is below the top surface of the gate electrode after the removal of the horizontal portions, exposing portions of the sidewalls of the gate.

3. The method of claim 2 comprises providing a protection layer covering and contacting the substrate, top surface and portions of sidewalls of the gate, and sidewall spacers immediately after forming the sidewall spacers.

4. The method of claim 3 wherein the protection layer includes a spin-on material.

5. The method of claim 4 wherein the spin-on material comprises a photoresist.

6. The method of claim 3 comprises performing a first etch to remove a portion of the protection layer to expose the top surface of the unsilicided gate electrode.

7. The method of claim 6 comprises performing a second etch to remove a portion of the unsilicided gate electrode to form the recess after the first etch such that the height $H_G$ of the gate is lower than the height $H_s$ of the sidewall spacers after the second etch.

8. The method of claim 7 comprises removing the protection layer after performing the second etch.

9. The method of claim 1 wherein depositing the single and continuous metal or metal alloy layer comprises depositing a nickel or nickel alloy layer.

10. The method of claim 1 wherein forming the gate comprises providing a gate dielectric layer and an unsilicided gate electrode layer over the gate dielectric layer; and
    comprises providing a hard mask layer over the unsilicided gate electrode layer prior to forming the gate.

11. The method of claim 10 comprises patterning the hard mask layer and wherein the gate is formed using the patterned hard mask.

12. The method of claim 11 wherein forming the sidewall spacers comprising:

providing a spacer layer over the patterned hard mask; and
removing horizontal portions of the spacer layer to form the sidewall spacers adjacent to and in direct contact with the sidewalls of the gate, wherein the top of the sidewall spacer is below a top surface of the patterned hard mask after the removal of the horizontal portions.

13. The method of claim 12 comprises removing the patterned hard mask after forming the sidewall spacers to form the recess such that the height HG of the gate is lower than the height Hs of the sidewall spacers.

14. The method of claim 1 wherein the metal or metal alloy silicide contacts disposed in the recess as well as partially within top portions of the gate electrode and diffusion regions comprise the same thickness and similar characteristics.

15. The method of claim 1 wherein the height $H_G$ of the gate is about 10 - 30 nm lower than the height $H_s$ of the sidewall spacers.

* * * * *